United States Patent [19]
Masuyuki et al.

[11] Patent Number: 6,137,562
[45] Date of Patent: *Oct. 24, 2000

[54] SUBSTRATE ADJUSTER, SUBSTRATE HOLDER AND SUBSTRATE HOLDING METHOD

[75] Inventors: Takashi Masuyuki, Tokyo; Katsuaki Ishimaru, Kawasaki, both of Japan

[73] Assignee: Nikon Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/291,199

[22] Filed: Apr. 14, 1999

Related U.S. Application Data

[63] Continuation of application No. 08/982,025, Dec. 1, 1997.

[30] Foreign Application Priority Data

Dec. 5, 1996 [JP] Japan ................................. 8-340618

[51] Int. Cl.[7] ........................... G03B 27/60; G03B 24/72; G03B 27/52; G01B 11/00
[52] U.S. Cl. ................................. 355/73; 355/53; 355/55; 356/400
[58] Field of Search ................... 355/75, 76, 72, 355/53, 45, 67, 55, 73; 250/548; 356/400

[56] References Cited

U.S. PATENT DOCUMENTS

| | | | |
|---|---|---|---|
| 5,563,683 | 10/1996 | Kamiya | 355/53 |
| 5,563,684 | 10/1996 | Stagaman | 355/72 |
| 5,717,482 | 2/1998 | Akutsu et al. | 355/53 |

*Primary Examiner*—Russell Adams
*Assistant Examiner*—Peter B. Kim
*Attorney, Agent, or Firm*—Nixon & Vanderhye P.C.

[57] ABSTRACT

When a relatively thin substrate, such as a silicon wafer, is used in an exposure apparatus, a substrate adjuster is inserted between the thin substrate and the substrate holder in order to raise the position of the top surface of the thin wafer. The substrate adjuster is selected so that the sum of the thicknesses of the substrate adjuster and the thin substrate lies within the range of thicknesses of ordinarily used substrates. If a relatively thick substrate, for example, a ceramic substrate, is used, the substrate is directly held on the substrate holder without using the substrate adjuster. The substrate holder holds the substrate adjuster through vacuum adsorption, which also helps the substrate be adsorbed onto the substrate adjuster. In this manner, different substrates having different thicknesses can be used in the exposure apparatus without exchanging the substrate holder.

18 Claims, 5 Drawing Sheets

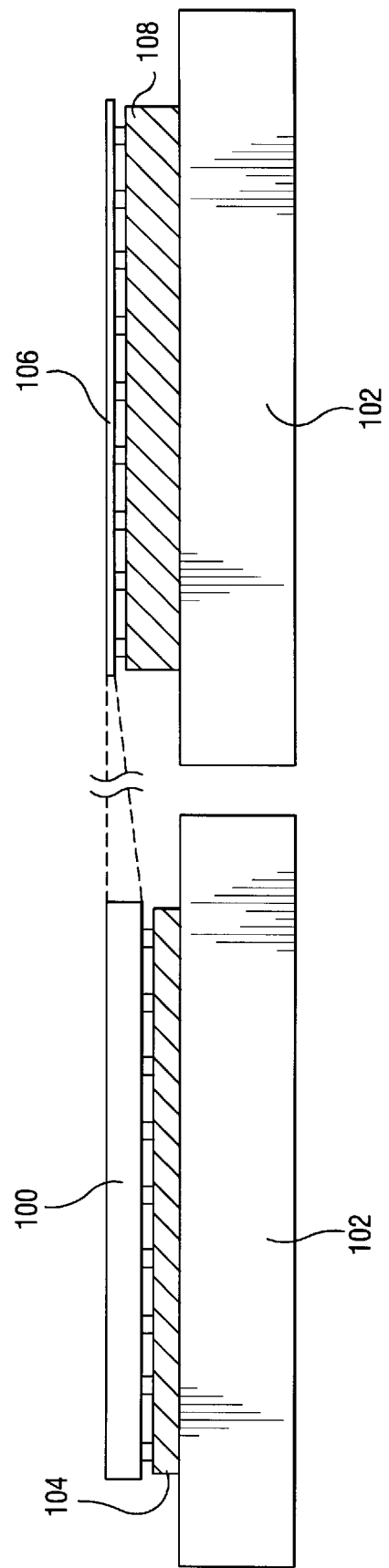

SUBSTRATE ADJUSTER, SUBSTRATE HOLDER AND SUBSTRATE HOLDING METHOD

This is a continuation of application Ser. No. 08/982,025, filed Dec. 1, 1997, now pending.

BACKGROUND OF THE INVENTION

This invention relates to an exposure apparatus for projecting a pattern onto a photosensitive substrate and, more particularly, to a substrate adjuster and a substrate holder, which are used in such an exposure apparatus to allow different types of substrates having different thicknesses to be appropriately exposed to exposure light, and to a method for holding such substrates.

In conventional exposure apparatuses, the driving range of a Z-stage (Z-direction stage) is set to a prescribed range so as to correspond to a certain range of thicknesses of the substrate used. In this case, when a pattern is projected onto a different type of substrate whose thickness is different from that of the previously used substrate, the substrate holder, which is fixed onto the Z-stage to hold a substrate, must be replaced with another one that is suited for the thickness of the new substrate. If the same substrate holder is used for the new substrate having a different thickness, the vertical position (i.e., the height) of the substrate surface may deviate from the image plane of the projecting lens system beyond the driving range of the Z-stage. In such a case, the substrate surface cannot be brought into the image plane by simply driving the substrate stage (Z-stage) in the vertical direction.

For example, a silicon wafer typically has a thickness of 0.5 mm, and a ceramic substrate has a thickness of 1 mm to 3 mm. When a pattern is transferred onto a silicon wafer through the exposure process, a relatively thick substrate holder is used. On the other hand, for a ceramic substrate, a substrate holder which is relatively thin is used. These examples are illustrated in FIGS. 5(A) and 5(B). In FIG. 5(A), a relatively thin holder 104 is fixed onto the substrate stage 102 to hold a ceramic substrate 100 by means of adsorption. In FIG. 5(B), a silicon wafer 106 is held by a relatively thick holder 108 through adsorption on the substrate stage 102. These substrate holders are usually screwed on the substrate stage 102. By using different substrate holders having different thicknesses, the substrate surface can be reliably brought into the image plane.

In this method, however, substrate holders must be screwed onto and off of the substrate stage 102 every time one holder is replaced with another. This replacement is troublesome and time-consuming, which causes the productivity of the exposure apparatus to drop. Furthermore, during the interchange of the substrate holders, the projection lens may be damaged, or dust may adhere onto the substrate stage, which adversely affects the precision of the pattern transfer and the image quality.

SUMMARY OF THE INVENTION

The present invention was conceived in view of these problems in the prior art, and aims to provide a substrate adjuster, a substrate holder, and a substrate holding method, by which various types of substrates having different thicknesses can be interchangeably used in an exposure apparatus in a simple and efficient fashion, while keeping the productivity of the exposure apparatus high and while reducing damage to the projection lens.

In order to eliminate the inconvenience of interchanging substrate holders, a substrate adjuster is inserted between the substrate and the substrate holder to adjust the height of the surface plane of the substrate. The substrate adjuster is easily attached to and removed from the substrate holder. In one aspect of the invention, the substrate holder is designed to hold the substrate adjuster in a simple manner. In the preferred arrangement, the substrate holder has an adsorption unit to hold the substrate adjuster through adsorption and, at the same time, to adsorb the substrate onto the substrate adjuster.

The substrate adjuster has a thickness that compensates for the difference between the thicknesses of different substrates. For example, if the substrate that is to be used is thinner than the normally used substrate, a substrate adjuster that has a thickness corresponding to the difference in thickness between the thin substrate to be used and the normally used substrate is simply inserted between the thin substrate and the substrate stage. The substrate adjuster may be inserted either automatically or manually. This inserting operation does not affect the projection lens system or the productivity of the exposure apparatus.

BRIEF DESCRIPTION OF THE DRAWINGS

The above and other objects, features, and advantages of the present invention are further described in the detailed description which follows, with reference to the attached drawings, wherein:

FIGS. 5(A) and 5(B) illustrate conventional substrate holders holding different types of substrates having different thicknesses.

DETAILED DESCRIPTION OF PREFERRED EMBODIMENTS

Figure 2:
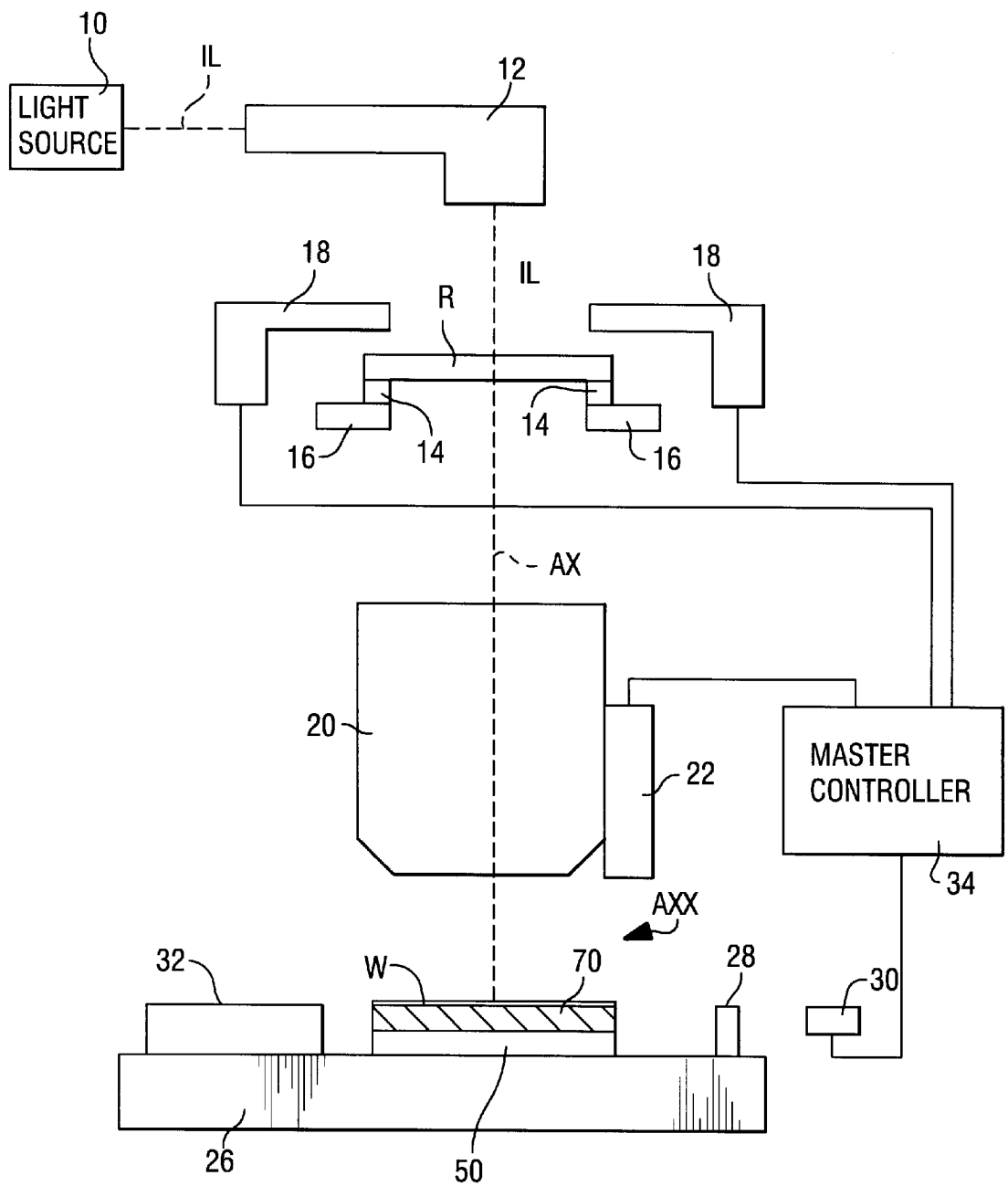
FIG. 2 illustrates the structure of an exposure apparatus to which the present invention is applied.

A preferred embodiment of the invention will now be described with reference to the attached drawings. FIG. 2 illustrates the structure of an exposure apparatus to which the present invention is applied. In the figure, a light source 10 emits exposure light IL. The exposure light IL passes through an illumination-optical system 12, which is composed of lenses and mirrors, and illuminates a reticle R mounted on a reticle stage 16. A mercury vapor lamp or an excimer laser is preferably used as the light source 10.

A reticle is a master plate on which a pattern (for example, an integrated circuit pattern) and an alignment mark (not shown) are formed. The reticle R is held by a reticle holder 14 through vacuum adsorption. The reticle holder 14 is fixed onto the reticle stage 16. A reticle alignment system 18 is positioned in the vicinity of the reticle R in order to align the reticle on the basis of detection of the alignment mark. The detection result is used to correctly align the reticle with respect to the exposure light. The reticle alignment system 18 includes an alignment microscope and an image sensor for taking in images.

The exposure light IL is transmitted through the reticle R to the projection-optical system 20. The projection-optical system 20 guides the exposure light IL onto a substrate W on which a photosensitizer has been applied. A substrate alignment system 22 is positioned near the projection-optical system 20 to detect an alignment mark on a substrate stage 26. The substrate alignment system 22 emits detection light having a wavelength that does not excite the photosensitizer (because if the photosensitizer reacts to the detection light, the precision of pattern transfer is adversely affected). The substrate alignment system 22 includes an alignment microscope and an image sensor for taking in images.

The substrate W is held by a substrate holder 50 via a substrate adjuster 70, which will be described below in detail. The substrate holder 50 is fixed onto the substrate stage 26 and holds the substrate W by means of adsorption. The substrate stage 26 moves so that the substrate holder 50 moves in a plane perpendicular to the optical axis AX of the projection-optical system 20. A pair of reflecting mirrors 28 are positioned on the top surface of the substrate stage 26 along two adjacent sides. A pair of interferometers 30 are provided near the substrate stage 26, each facing one of the reflecting mirrors 28. The interferometers 30 and the reflecting mirrors 28 comprise a position detecting system to accurately detect the X and Y positions of the substrate stage 26 using beam reflection. Another position detecting system, which is composed of reflecting mirrors and interferometers, may be positioned near the reticle stage 16 if necessary. A reference plate 32 is also positioned on the substrate stage 26 so that the top surface of the reference plate 32 aligns with the top surface of the substrate W. The reference plate 32 bears a necessary number of alignment marks (not shown).

The detection result of the substrate alignment system 22 (i.e., image signals representing the detected alignment mark) is supplied to a master controller 34. The outputs from the reticle alignment system 18 and interferometers 30 are also supplied to the master controller 34. Based on these data, the master controller 34 causes the reticle stage 16 and the substrate stage 26 to move to correct positions so that the reticle R and the substrate W are appropriately aligned with respect to the projection-optical system 20. The master controller 34 also controls the entire exposure process (e.g., a step-and-repeat type exposure process) of the exposure apparatus.

In the operation of the exposure apparatus, reticle alignment is performed prior to exposure so that the pattern of the reticle R is precisely superimposed onto the circuit pattern that has already been formed on the substrate W. In this step, the master controller 34 causes the substrate stage driving system (not shown) to move the substrate stage 26 so that the reference plate 32 is positioned under the optical axis AXX of the substrate alignment system 22. The substrate alignment system 22 detects one of the substrate alignment marks formed on the reference plate 32. At the same time, the master controller 34 causes the reticle stage driving system (not shown) to move the reticle stage 16 so that the reticle alignment mark is positioned under the reticle alignment system 18. The images detected by the reticle alignment system 18 and the substrate alignment system 22 are supplied to the master controller 34. Then, the master controller 34 controls the reticle stage 16 and/or the substrate stage 26 so that the image of the reticle alignment mark is aligned with the detected substrate alignment mark on the reference plate 32, based on the supplied image data. In this step, the reticle stage 16 and/or the substrate stage 26 are shifted or rotated until the center of the reticle alignment mark image lines up with the center of the substrate alignment mark.

Another mark on the reference plate 32 is used to move the substrate W the exact base-line amount BL (i.e., the distance between the optical axis AX of the projection-optical system 20 and the optical axis AXX of the substrate alignment system 22).

The substrate W has multiple shot areas, and the reticle pattern is successively superimposed onto the circuit pattern, which has already been formed on each shot area During exposure of any given shot area, that shot area is aligned with the optical axis AXX of the substrate alignment system 22. Then, the substrate W is moved toward the projection-optical system 20 by the base-line amount, whereby the center of the existing circuit pattern on the current shot area is aligned with the center of the reticle pattern image. At this point, the light source 10 emits exposure light IL to the reticle R via the illumination-optical system 12. The reticle R is illuminated by the exposure light IL at a uniform illuminance under prescribed conditions. The exposure light IL that is transmitted through the reticle R enters the projection-optical system 20, which then forms a reticle pattern image on the substrate W. Thus, the circuit pattern of the reticle R is superimposed onto the wafer circuit pattern, which has already been formed on the substrate W. This process is repeated for all of the shot areas on the substrate W by moving the substrate stage 26 and, therefore, the substrate W in a plane perpendicular to the optical axis AX of the projection-optical system 20.

Figures 1A, 1B:
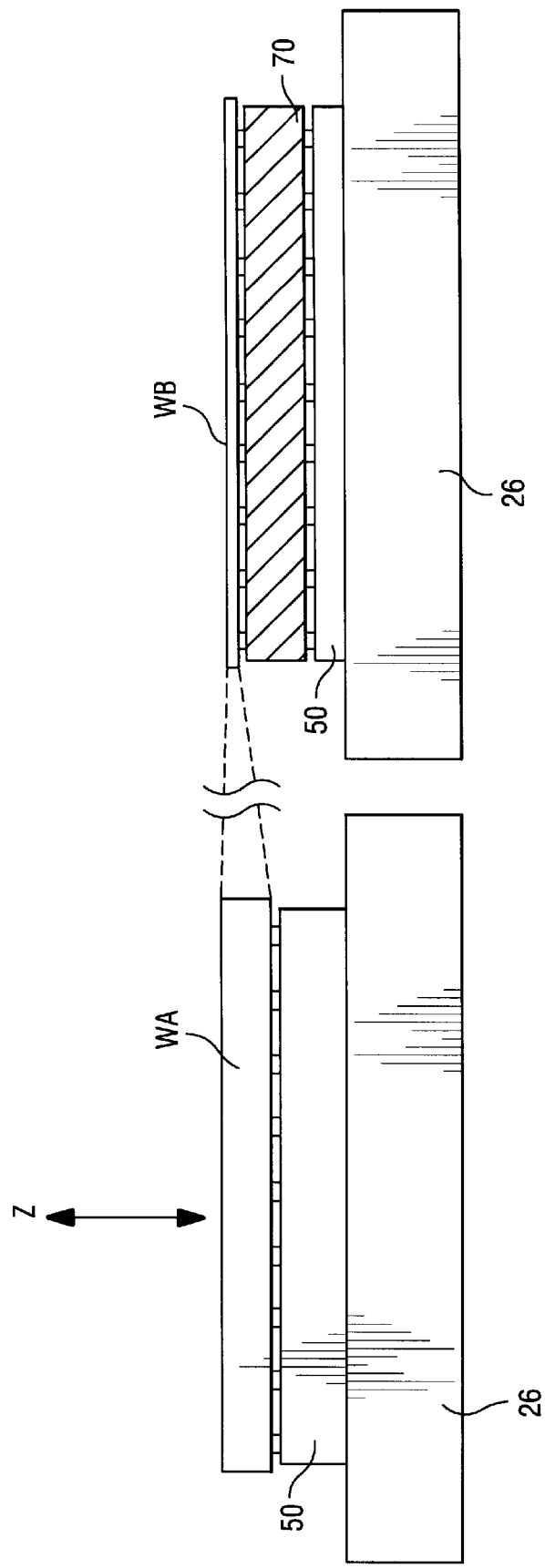
FIGS. 1(A) and 1(B) illustrate in cross-sectional views how substrates having different thicknesses are held onto the substrate holder with or without a substrate adjuster therebetween as the thickness requires.

As one feature of the invention, a substrate adjuster 70 is inserted between the substrate W and the substrate holder 50 if the thickness of the substrate W used requires it. If a relatively thick substrate WA (for example, a ceramic plate) is used, as shown in FIG. 1 (A), the substrate adjuster 70 is not inserted between the substrate holder 50 and the substrate WA. In this case, the substrate WA is directly held by the substrate holder 50 through vacuum adsorption. However, if a relatively thin substrate WB (such as a silicon wafer) is used, as shown in FIG. 1(B), a substrate adjuster 70 is inserted, and the substrate WB is adsorbed onto the substrate holder 50 via the adjuster 70.

The thickness of the substrate holder 50 is generally set to a value that is suitable for the thickness of ordinary substrates that are used most frequently in that exposure apparatus. Accordingly, as long as the ordinary substrates are used in the exposure apparatus, the vertical position (or the height) of the substrate surface is adjusted by simply moving the substrate stage 26 and the substrate holder 50 in the Z direction. However, when a substrate is used whose thickness differs from the thickness of the ordinary substrates, a substrate adjuster 70 is inserted between the substrate and the substrate holder 50 so as to bring the substrate surface in alignment with the image plane of the projection-optical system 20. The substrate holder 50, which is screwed onto the substrate stage 26, does not have to be changed.

Figure 3:
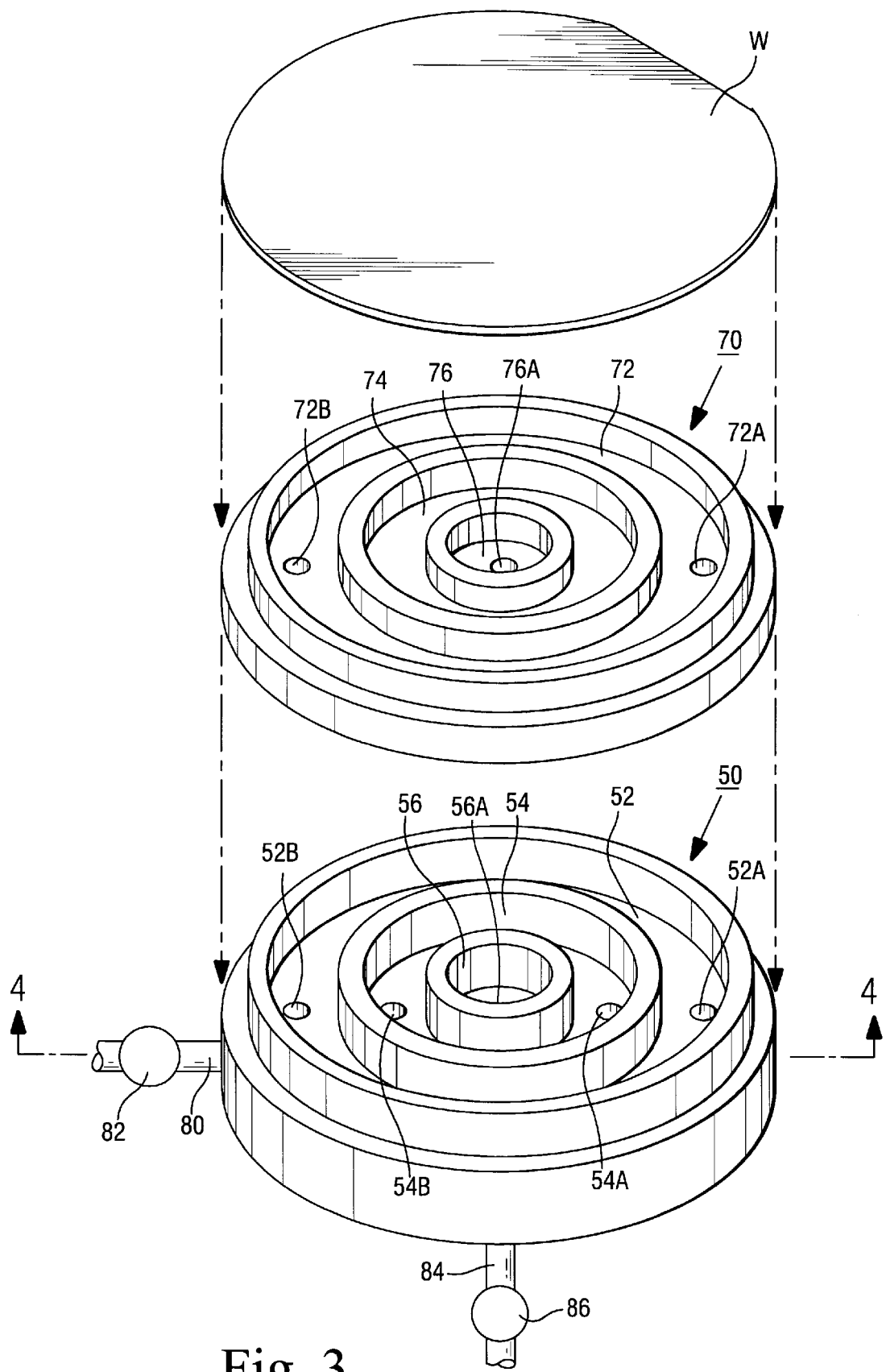
FIG. 3 is an exploded perspective view, showing the positional relation between the substrate holder, the substrate adjuster, and the substrate.

FIG. 3 is an enlarged exploded view showing the details of the substrate holder 50, the substrate adjuster 70, and the substrate W. The substrate holder 50 has concentric grooves 52, 54 and 56. Groove 52 has adsorption holes 52A and 52B at the bottom, groove 54 has adsorption holes 54A and 54B at the bottom, and groove (or recess) 56 has an adsorption hole 56A (see FIG. 4). Vacuum pressure (negative pressure) is applied to the substrate W through these adsorption holes to secure the substrate W to the substrate holder 50. Similarly, the substrate adjuster 70 has concentric grooves 72, 74 and 76. Groove 72 has adsorption holes 72A and 72B at the bottom, and groove 76 has an adsorption hole 76A at the bottom.

Figure 4:
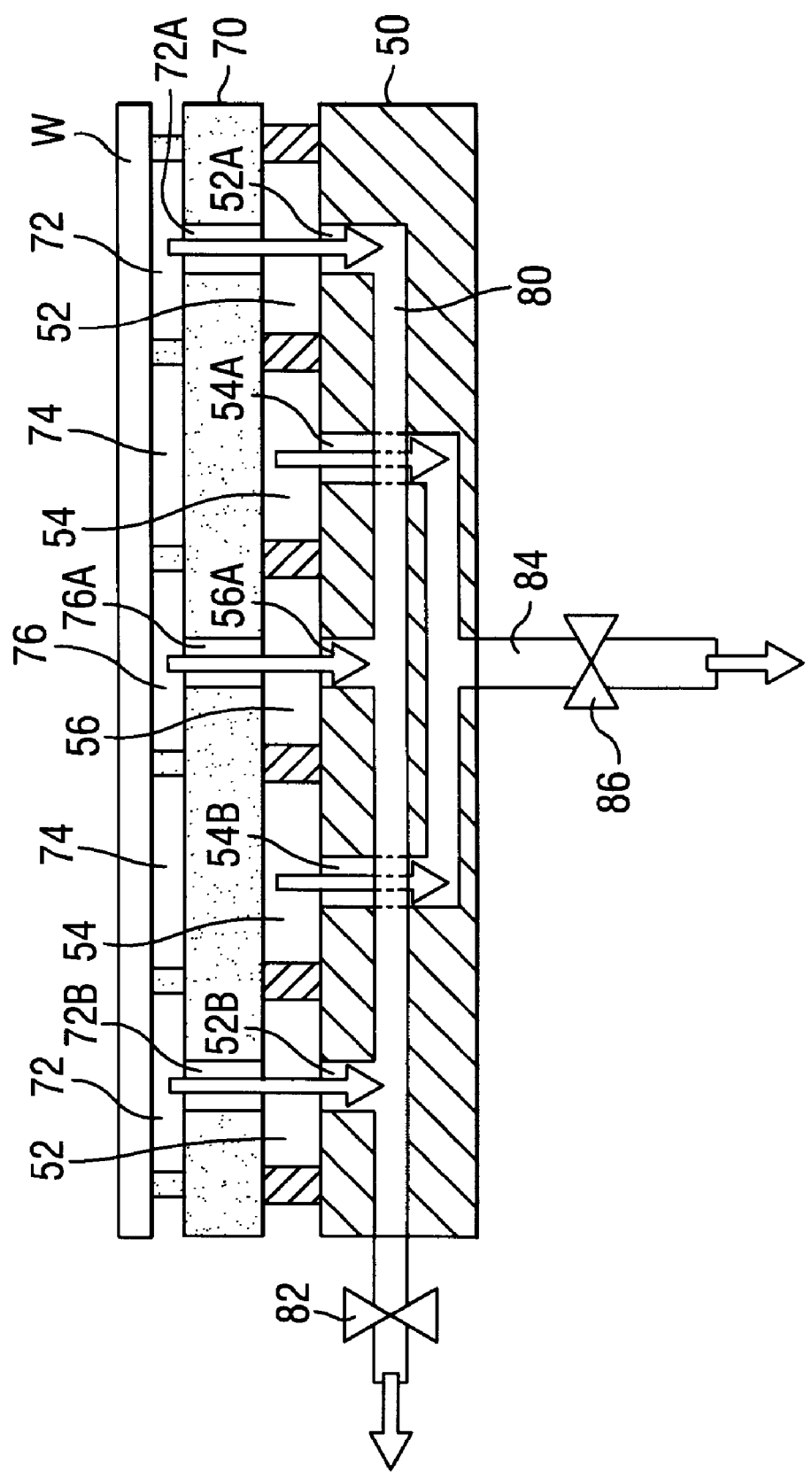
FIG. 4 is a cross-sectional view of the structure in FIG. 3.

FIG. 4 is a cross-sectional view taken along the line 4—4 shown in FIG. 3, showing how the substrate holder 50 holds the substrate W via the substrate adjuster 70 through vacuum adsorption. As shown in FIG. 4, there are two vacuum-supply routes, one for the substrate W (referred to as a substrate-adsorption route), the other for the substrate adjuster 70 (referred to as an adjuster-adsorption route). In the substrate-adsorption route, the adsorption holes 72A, 72B, and 76A of the substrate adjuster 70 are connected to the adsorption holes 52A, 52B, and 56A, which are then connected to the vacuum supply path 80. The vacuum supply path 80 leads to the vacuum supply source (not shown) through a valve 82. On the other hand, in the adjuster-adsorption route, the adsorption holes 54A and 54B are connected to the vacuum supply path 84, which is connected to the vacuum supply source (not shown) through the valve 86. In this embodiment, every other groove is used for the substrate-adsorption route; however, the invention is not limited to this arrangement. The valves 82 and 86 may either be manually operated or electrically controlled (as in an electromagnetic valve).

The valves 82 and 86 are closed when the substrate holder does not hold the substrate W. In the operation of the exposure apparatus, when a relatively thin substrate W is used, a substrate adjuster 70 is positioned on the substrate holder 50, as shown in FIG. 1. The substrate adjuster 70 is preferably automatically transported to and positioned on the substrate holder 50 by, for example, a loader that normally transports and positions the substrate W onto the substrate holder 50. Alternatively, the operator may manually put the substrate adjuster 70 on the substrate holder 50. When the substrate adjuster 70 has been correctly positioned on the substrate holder 50, the adjuster valve 86 is opened, whereby the vacuum supply path 84 is connected to the vacuum supply source. Negative pressure is applied through the adsorption holes 54A and 54B to the groove 54. The substrate adjuster 70 is thus secured to the substrate holder 50 through vacuum adsorption.

Then, the substrate W is automatically transported to and positioned on the substrate adjuster 70 by the loader. When the substrate W has been correctly put on the substrate adjuster 70, the substrate valve 82 is opened, whereby the vacuum supply path 80 is connected to the vacuum supply source. Negative pressure is applied to the grooves 52 and 56 of the substrate holder 50 through the adsorption holes 52A, 52B, and 56A and also to the grooves 72 and 76 of the substrate adjuster 70 through the adsorption holes 72A, 72B, and 76A. Thus, the substrate W is secured to the substrate adjuster 70 through the vacuum adsorption applied to the grooves 72 and 76.

The substrate adjuster 70, which is inserted between the thin substrate W and the substrate holder 50, is selected so that the sum of the thicknesses of the substrate adjuster 70 and the thin substrate W lies within the range of thickness of ordinarily used substrates. Accordingly, the top surface of the substrate W can be brought into the image surface of the projection-optical system 20 by simply moving the substrate stage 26 (and therefore, the substrate holder 50) in the Z direction within the driving range of the substrate stage 26. The substrate adjuster 70 also helps the top surface of the substrate W align with the top surface of the reference plate 32. After the substrate surface and the reference plate surface are correctly positioned in the image plane, position adjustment of the reticle R, measurement of the base line, alignment of the substrate W with respect to the projection-optical system 20, and exposure of the current shot area of the substrate W are successively performed.

When all of the shot areas have been exposed to exposure light, the substrate is changed. The valve 82 is closed to cut off the vacuum adsorption applied to the substrate W. At this time, the valve 86 is kept open so as to keep the substrate adjuster 70 continuously fixed to the substrate holder 50. However, if an ordinary substrate is used next, the adsorption to the substrate adjuster 70 is cut off in order to remove the substrate adjuster 70 from the substrate holder 50. In this case, one or both of valves 82 and 86 are then opened to fix the ordinary substrate directly to the substrate holder 50 by means of vacuum adsorption.

As has been described above, a substrate adjuster 70 is inserted between the substrate W and the substrate holder 50 in a removable fashion if the substrate to be used is relatively thin compared with normally used substrates. Since the relative deficiency in the thickness of the substrate can be compensated for by simply employing the substrate adjuster 70, the substrate surface can be brought into the image plane reliably, without exchanging the substrate holder 50 itself. Consequently, damage to the projection lenses or adverse effects on other parts of the exposure apparatus, such as dust adhesion, can be greatly reduced, while productivity is improved. Because the substrate adjuster is easily attachable and detachable, it can be washed and cleaned if, for example, dust adheres on it, thereby keeping its top surface, which is used for supporting the substrate, even and smooth.

The present invention is applicable to various fields, and there are many modifications other than the preferred embodiments described above. Such applications and modifications may include:

(1) The substrate adjuster, the substrate holder, and the holding method according to the invention can be applied to a scanning-type exposure apparatus in which both the mask and the substrate are scanned relative to each other to transfer the pattern of the mask onto the substrate;

(2) Although, in the embodiment, two types of substrates (a relatively thin silicon wafer and a relatively thick ceramic substrate) are used, three or more types of substrates having different thicknesses can be used in an exposure apparatus. In this case, substrate adjusters are selected whose thicknesses correspond to the relative deficiency of the thicknesses of the substrates. By this means, the substrate surface can be reliably brought into alignment with the image plane of the projection-optical system. If the difference in the thickness of two substrates lies within the driving range (in the Z direction) of the substrate stage, the same substrate adjuster can be used for these two substrates. In this case, the vertical position (height) of the substrate surface is adjusted by simply driving the substrate stage up and down. One or more substrate adjusters may be inserted between the substrate and the substrate holder when the difference in the thickness of the substrates is large;

(3) The same material as that of the substrate holder may be used as the material of the substrate adjuster. For example, if the substrate holder is made of ceramic, a ceramic adjuster may be used. However, of course, a different material, for example, the same material as the substrate may be used; and (4) The arrangement and the shapes of the grooves and the adsorption holes can be arbitrarily changed as necessary, as long as the substrate and the substrate adjuster are independently held on the substrate holder through vacuum adsorption. The arrangement of the grooves is not limited to concentric circles. Alternatively, chuck means may be used to hold the substrate and the substrate adjuster, instead of the vacuum adsorption means.

While the invention has been described by way of exemplary embodiments, it is understood that many other changes and substitutions may be made by those skilled in the art without departing from the spirit and the scope of the invention, which is defined by the appended claims.

What is claimed is:

1. A substrate adjuster detachably insertable between a substrate holder and a substrate having a top surface, said substrate adjuster changing a position of the top surface of the substrate relative to the substrate holder and comprising:
   a plurality of ridges defining at least one groove facing a substrate side of said substrate adjuster; and
   at least one adsorption hole disposed between said ridges in said at least one groove.

2. A substrate adjuster as claimed in claim 1, comprising at least one adsorption hole.

3. A substrate adjuster as claimed in claim 1, wherein said plurality of ridges comprises three substantially circular ridges defining at least two concentric grooves.

4. A substrate adjuster as claimed in claim 3, comprising at least one adsorption hole disposed between each of said ridges in each of said grooves.

5. A substrate holder holding a substrate having a top surface, the substrate holder having a substrate adjuster engaging section that is shaped to receive a substrate adjuster, which is detachably insertable between the substrate holder and the substrate in order to change a position of the top surface of the substrate relative to the substrate holder, the substrate holder comprising an adsorption unit operatively coupled with said substrate adjuster engaging section, said adsorption unit holding the substrate adjuster through adsorption and, at the same time, adsorbing the substrate onto the substrate adjuster.

6. A substrate holder as claimed in claim 5, further comprising a substrate adjuster coupled with said substrate adjuster engaging section and at least a first adsorption hole, said substrate adjuster comprising at least a second adsorption hole aligned with the first adsorption hole.

7. A substrate holder as claimed in claim 6, wherein said first adsorption hole comprises at least one substrate adsorption hole and at least one adjuster adsorption hole, and wherein said second adsorption hole comprises at least one corresponding substrate adsorption hole aligned with said at least one substrate adsorption hole of said first adsorption hole.

8. A substrate holder as claimed in claim 7, wherein said substrate adsorption unit communicates with said at least one substrate adsorption hole and said corresponding substrate adsorption hole, said substrate adsorption unit adsorbing the substrate onto the substrate adjuster via said at least one substrate adsorption hole and said corresponding substrate adsorption hole.

9. A substrate holder as claimed in claim 8, further comprising an adjuster adsorption unit communicating with said at least one adjuster adsorption hole, said adjuster adsorption unit adsorbing said substrate adjuster onto the substrate holder via said at least one adjuster adsorption hole.

10. A substrate holder as claimed in claim 6, further comprising a first plurality of ridges defining at least a first groove facing an adjuster side of said substrate holder, said first adsorption hole being disposed between said ridges in said first groove, wherein said substrate adjuster comprises a second plurality of ridges defining at least a second groove facing a substrate side of said adjuster, said second adsorption hole being disposed between said ridges in said second groove.

11. A substrate holder as claimed in claim 10, wherein said first plurality of ridges comprises three substantially circular ridges defining at least two concentric first grooves, and wherein said second plurality of ridges comprises three substantially circular ridges defining at least two concentric second grooves corresponding to said at least two concentric first grooves.

12. A substrate holder as claimed in claim 11, wherein said first adsorption hole comprises at least one substrate adsorption hole and at least one adjuster adsorption hole, and wherein said second adsorption hole comprises at least one corresponding substrate adsorption hole aligned with said at least one substrate adsorption hole of said first adsorption hole.

13. A substrate holder as claimed in claim 12, wherein said substrate adsorption unit communicates with said at least one substrate adsorption hole and said corresponding substrate adsorption hole, said substrate adsorption unit adsorbing the substrate onto the substrate adjuster via said at least one substrate adsorption hole and said corresponding substrate adsorption hole.

14. A substrate holder as claimed in claim 13, further comprising an adjuster adsorption unit communicating with said at least one adjuster adsorption hole, said adjuster adsorption unit adsorbing said substrate adjuster onto the substrate holder via said at least one adjuster adsorption hole.

15. A substrate holding method for holding substrates, the method comprising the step of selectively inserting a substrate adjuster between the substrate and a substrate holder to change a position of the substrate, and selectively supporting either (1) the substrate without the substrate adjuster through adsorption or (2) the substrate adjuster through adsorption and at the same time adsorbing the substrate on the substrate adjuster.

16. An exposure apparatus comprising:
   a projection system disposed between a mask and a substrate, which projects a pattern image of the mask on an image plane side of the projection system;
   a substrate holder selectively holding a substrate directly or a substrate adjuster on which a substrate is held, wherein at least part of the substrate holder is on the image plane side of the projection system; and
   an adsorption unit connected to the substrate holder, the adsorption unit holding the substrate adjuster through adsorption and, at the same time, adsorbing the substrate on the substrate adjuster.

17. A method for making an exposure apparatus comprising:
   providing a projection system disposed between a mask and a substrate, which projects a pattern image of the mask on an image plane side of the projection system;
   providing a substrate holder selectively holding a substrate directly or a substrate adjuster on which a substrate is held, wherein at least part of the substrate holder is on the image plane side of the projection system; and
   providing an adsorption unit, connected to the substrate holder, that holds the substrate adjuster through adsorption and, at the same time, adsorbs the substrate on the substrate adjuster.

18. A substrate supporting assembly for holding a substrate, the substrate supporting assembly comprising:
   a substrate holder;
   a substrate adjuster detachably insertable between the substrate holder and the substrate to selectively change a position of the substrate; and
   an adsorption unit that selectively secures the substrate and the substrate adjuster to the substrate holder via vacuum adsorption, wherein said adsorption unit holds the substrate adjuster through adsorbing and, at the same time, adsorbs the substrate on the substrate adjuster.

* * * * *